(12) United States Patent
Wayton et al.

(10) Patent No.: US 6,852,421 B2
(45) Date of Patent: Feb. 8, 2005

(54) COATING COMPOSITIONS FOR USE WITH AN OVERCOATED PHOTORESIST

(75) Inventors: Gerald B. Wayton, Leicester, MA (US); Peter Trefonas, III, Medway, MA (US); Suzanne Coley, Mansfield, MA (US); Tomoki Kurihara, Niigata (JP)

(73) Assignee: Shipley Company, L.L.C., Marlborough, MA (US)

( * ) Notice: Subject to any disclaimer, the term of this patent is extended or adjusted under 35 U.S.C. 154(b) by 22 days.

(21) Appl. No.: 10/256,225

(22) Filed: Sep. 26, 2002

(65) Prior Publication Data
US 2003/0180559 A1 Sep. 25, 2003

Related U.S. Application Data
(60) Provisional application No. 60/325,254, filed on Sep. 26, 2001.

(51) Int. Cl.[7] .................. B32B 27/08; B32B 27/36; G03C 1/825; G03C 1/835; C08G 63/40
(52) U.S. Cl. .................. 428/480; 430/271.1; 430/325; 430/523; 430/531; 430/533; 528/288; 528/289; 528/291; 528/292
(58) Field of Search ................ 428/480; 430/271.1, 430/325, 523, 531, 533, 905, 908; 528/288, 289, 291, 292

(56) References Cited

U.S. PATENT DOCUMENTS

| | | | |
|---|---|---|---|
| 3,265,694 A | * 8/1966 | Walles et al. | 544/221 |
| 3,448,084 A | * 6/1969 | Francis et al. | 528/289 |
| 3,651,173 A | * 3/1972 | Doi et al. | 525/45 |
| 3,658,801 A | * 4/1972 | Berry et al. | 544/221 |
| 3,737,432 A | * 6/1973 | George et al. | 544/222 |
| 3,763,276 A | * 10/1973 | Kolyer et al. | 524/413 |
| 3,780,133 A | * 12/1973 | Kolyer et al. | 525/34 |
| 5,525,457 A | 6/1996 | Nemoto et al. | 430/325 |
| 5,693,691 A | 12/1997 | Flaim et al. | 523/436 |
| 5,935,760 A | * 8/1999 | Shao et al. | 430/271.1 |
| 5,939,236 A | 8/1999 | Pavelchek et al. | 430/273.1 |
| 6,033,830 A | 3/2000 | Sinta et al. | 430/325 |
| 6,042,990 A | * 3/2000 | Shao et al. | 430/271.1 |
| 6,048,662 A | 4/2000 | Bruhnke et al. | 430/270.1 |
| 6,080,530 A | * 6/2000 | Shao et al. | 430/325 |
| 6,117,618 A | 9/2000 | Yedur et al. | 430/296 |
| 6,156,479 A | 12/2000 | Meador et al. | 430/270.1 |
| 6,165,684 A | * 12/2000 | Mizutani et al. | 430/271.1 |
| 6,190,839 B1 | 2/2001 | Pavelchek et al. | 430/325 |
| 6,261,743 B1 | 7/2001 | Pavelchek et al. | 430/325 |

(List continued on next page.)

FOREIGN PATENT DOCUMENTS

| | | |
|---|---|---|
| EP | 0698823 B1 | 2/1996 |
| WO | WO 99/56178 | 11/1999 |
| WO | WO 02/086624 A1 | 10/2002 |

OTHER PUBLICATIONS

U.S. Appl. No. 10/266,097, filed Oct. 6, 2002, Wayton et al.
T. Yu et al., Proc. SPIE, 4345:945–951 (2001).
J. Meador et al., Proc. SPIE, 4345:846–854 (2001).
S. Deshpande et al., Proc. SPIE, 4345:855–863 (2001).
T. Kishioka et al., Proc. SPIE, 4345:816–820 (2001).

Primary Examiner—Vivian Chen
(74) Attorney, Agent, or Firm—Peter F. Corless; Darryl P. Frickey; Edwards & Angell, LLP

(57) ABSTRACT

In a first aspect, organic coating compositions are provided, particularly spin-on antireflective coating compositions, that contain a polyester resin component. In a further aspect, coating compositions are provided that contain a resin component obtained by polymerization of a multi-hydroxy compound. Coating compositions of the invention are particularly useful employed in combination with an overcoated photoresist layer to manufacture integrated circuits.

14 Claims, 5 Drawing Sheets

U.S. PATENT DOCUMENTS

| | | |
|---|---|---|
| 6,316,165 B1 | 11/2001 | Pavelchek et al. ........... 430/311 |
| 6,323,310 B1 | 11/2001 | Puligadda et al. ........... 528/423 |
| 6,399,686 B1 * | 6/2002 | Puligadda et al. ........... 524/284 |
| 6,410,209 B1 | 6/2002 | Adams et al. ............... 430/311 |
| 6,444,320 B1 | 9/2002 | Takei et al. ................. 428/413 |
| 6,503,689 B2 | 1/2003 | Zampini et al. .......... 430/270.1 |
| 6,524,708 B2 | 2/2003 | Puligadda et al. ....... 428/411.1 |
| 6,528,235 B2 | 3/2003 | Thackeray et al. ...... 430/271.1 |
| 6,576,681 B2 | 6/2003 | Zampini et al. ............... 521/77 |
| 6,599,951 B2 | 7/2003 | Zampini et al. ............... 521/50 |
| 6,602,652 B2 | 8/2003 | Adams et al. ............... 430/311 |
| 6,653,049 B2 | 11/2003 | Pavelchek et al. ........ 430/272.1 |
| 2002/0022196 A1 | 2/2002 | Pavelchek et al. ........... 430/311 |
| 2002/0028408 A1 | 3/2002 | Mao et al. ................ 430/271.1 |
| 2002/0031729 A1 | 3/2002 | Trefonas, III et al. ...... 430/322 |
| 2002/0045125 A1 | 4/2002 | Shao et al. ............... 430/270.1 |
| 2003/0065164 A1 | 4/2003 | Puligadda et al. ............. 536/58 |
| 2003/0129531 A1 | 7/2003 | Oberlander et al. ...... 430/271.1 |
| 2003/0129542 A1 | 7/2003 | Shih et al. .................. 430/311 |
| 2004/0023156 A1 * | 2/2004 | McGinness et al. ...... 430/271.1 |
| 2004/0029042 A1 | 2/2004 | Taylor et al. ............. 430/272.1 |
| 2004/0067437 A1 * | 4/2004 | Wayton et al. ........... 430/271.1 |

* cited by examiner

Example 37a　　　　　　　Example 37b　　　　　　　Example 37c

Example 50

Example 51

Example 52

Example 53

Example 54

COATING COMPOSITIONS FOR USE WITH AN OVERCOATED PHOTORESIST

The present application claims the benefit of U.S. provisional patent application No. 60/325,254, filed Sep. 26, 2001, which is incorporated herein by reference in its entirety.

BACKGROUND OF THE INVENTION

1. Field of the Invention

The present invention relates to compositions (particularly antireflective coating compositions or "ARCs") that can reduce reflection of exposing radiation from a substrate back into an overcoated photoresist layer and/or function as a planarizing or via-fill layer. More particularly, the invention relates to organic coating compositions, particularly antireflective coating compositions, that contain a polyester resin component.

2. Background

Photoresists are photosensitive films used for the transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced or chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less soluble in the developer solution. Photoresist compositions are described in Deforest, *Photoresist Materials and Processes*, McGraw Hill Book Company, New York, ch. 2, 1975 and by Moreau, *Semiconductor Lithography, Principles, Practices and Materials,* Plenum Press, New York, ch. 2 and 4.

A major use of photoresists is in semiconductor manufacture where an object is to convert a highly polished semiconductor slice, such as silicon or gallium arsenide, into a complex matrix of electron conducting paths, preferably of micron or submicron geometry, that perform circuit functions. Proper photoresist processing is a key to attaining this object. While there is a strong interdependency among the various photoresist processing steps, exposure is believed to be one of the most important steps in attaining high resolution photoresist images.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is non intended, again resulting in linewidth variations. The amount of scattering and reflection will typically vary from region to region, resulting in further linewidth non-uniformity. Variations in substrate topography also can give rise to resolution-limiting problems.

One approach used to reduce the problem of reflected radiation has been the use of a radiation absorbing layer interposed between the substrate surface and the photoresist coating layer. See for example, PCT Application WO 90/03598, EPO Application No. 0 639 941 A1 and U.S. Pat. Nos. 4,910,122, 4,370,405, 4,362,809, and 5,939,236. Such layers have also been referred to as antireflective layers or antireflective compositions. See also U.S. Pat. Nos. 5,939,236; 5,886,102; 5,851,738; and 5,851,730, all assigned to the Shipley Company, which disclose highly useful antireflective compositions.

SUMMARY OF THE INVENTION

We have now discovered new antireflective compositions ("ARCs") for use with an overcoated photoresist layer.

More specifically, organic coating compositions, particularly antireflective compositions for use with an overcoated photoresist, are provided that comprise a resin component that contains ester repeat units (polyester), such as provided by polymerization of a carboxy-containing compound (such as a carboxylic acid, ester, anhydride, etc.) and a hydroxy-containing compound, preferably a compound having multiple hydroxy groups such as a glycol, e.g. ethylene glycol or propylene glycol, or glycerol, or other diols, triols, tetraols and the like.

Preferably, an ester functionality is present as a component of, or within, the polymer backbone rather than as a pendant or side chain unit. Ester moieties also may be present as a pendant group, but preferably the polymer also contains an ester functionality along the polymer backbone. Also preferred is where the ester repeat unit comprises aromatic substitution, such as optionally substituted carbocyclic aryl groups e.g. optionally substituted phenyl, naphthyl or anthracenyl substitution, either as a side chain or more preferably along the polymer backbone.

In a further aspect, organic coating compositions, particularly antireflective compositions for use with an overcoated photoresist, are provided that comprise a resin component that is obtained from polymerization of one or more monomers, oligomers or other polymerized subunits or materials that comprise hydroxy groups, e.g. 2, 3, or 4 hydroxy groups per monomer. Preferably, such hydroxy-containing polymerizable materials are reacted to form a polyester resin as discussed above, particularly by reaction of the hydroxy-containing carboxy-containing compound (such as a carboxylic acid, ester, anhydride, etc.). Exemplary hydroxy-containing polymerizable materials include diol, triols and tetraols such as a glycol, e.g. ethylene glycol or propylene glycol, or glycerol.

Coating compositions of the invention preferably are crosslinking compositions and contain a material that will crosslink or otherwise cure upon e.g. thermal or activating radiation treatment. Typically, the composition will contain a crosslinker component, e.g. an amine-containing material such as a melamine or benzoguanamine compound or resin.

Preferably, crosslinking compositions of the invention can be cured through thermal treatment of the composition coating layer. Suitably, the coating composition also contains an acid or more preferably an acid generator compound, particularly a thermal acid generator compound, to facilitate the crosslinking reaction.

For use as an antireflective coating composition, as well as other applications such as via-fill, preferably the composition is crosslinked prior to applying a photoresist composition layer over the composition layer.

Antireflective compositions of the invention also preferably contain a component that comprises chromophore groups that can absorb undesired radiation used to expose the overcoated resist layer from reflecting back into the resist layer. Such chromophore groups may be present with other composition components such as the polyester resin or an acid generator compound, or the composition may comprise another component that may comprise such chromophore units, e.g. a resin separate from the polyester resin that contains chromophore substitution, or a small molecule (e.g. MW less than about 1000 or 500) that contains one or more chromophore moieties, such as one or more optionally substituted phenyl, optionally substituted anthracene or optionally substituted naphthyl groups.

Generally preferred chromophores for inclusion in coating composition of the invention particularly those used for antireflective applications include both single ring and multiple ring aromatic groups such as optionally substituted phenyl, optionally substituted naphthyl, optionally substituted anthracenyl, optionally substituted phenanthracenyl, optionally substituted quinolinyl, and the like. Particularly preferred chromophores may vary with the radiation employed to expose an overcoated resist layer. More specifically, for exposure of an overcoated resist at 248 nm, optionally substituted anthracene and optionally substituted naphthyl are preferred chromophores of the antireflective composition. For exposure of an overcoated resist at 193 nm, optionally substituted phenyl and optionally substituted naphthyl are particularly preferred chromophores of the antireflective composition. Preferably, such chromophore groups are linked (e.g. pendant groups) to a resin component of the antireflective composition, such as the polyester resin as discussed above. Particularly preferred chromophore groups are aryl dicarboxylates, particularly naphthyl dicarboxylate and phenyl dicarboxylate groups.

Coating compositions of the invention are typically formulated and applied to a substrate as an organic solvent solution, suitably by spin-coating (i.e. a spin-on composition). In a preferred aspect, compositions of the invention are formulated with a solvent component that comprises one or more oxyisobutyric acid esters, particularly methyl-2-hydroxyisobutyrate. Especially preferred coating compositions of the invention include a polyester resin, particularly having ester repeat units as a component of the polymer backbone, and formulated with a solvent component that comprises one or more oxyisobutyric acid esters such as methyl-2-hydroxyisobutyrate.

In a further aspect of the invention, antireflective compositions for use with an overcoated photoresist are provided that have a plurality of resins selected to provide desired real (n) and imaginary (k) refractive index values for the antireflective composition at the exposure wavelength. As is known, the refractive index of an antireflective composition at the exposure wavelength is the complex number $N=n i k$, where n is the real part of N, and is equivalent to what is commonly called "the refractive index", k is the imaginary part of N and is related to the absorption coefficient as a function of the exposure wavelength.

More particularly, in this aspect of the invention, an antireflective composition of the invention is formulated with a plurality of resins, at least one of the resins preferably being a polyester resin and/or being formed from a multi-hydroxy material, to provide targeted real and imaginary refractive index values. A preferred blend partner is an acrylate resin such as the anthracene acrylate polymers (particularly polymers that contain polymerized repeat units of hydroxyethyl methacrylate or hydroxyethyl acrylate and methylanthracene methacrylate or other anthracene acrylate) such as disclosed in U.S. Pat. No. 5,886,102 assigned to the Shipley Company.

Preferred methods including attaining a desired target real index n from between about 1.5 (particularly 1.50) to about 2.1 (particularly 2.10) and a desired imaginary index k from about 0.2 (particularly 0.20) to 0.7 (particularly 0.70) by admixing (blending) a polyester resin and an acrylate resin in an antireflective composition of the invention. Preferably, the polyester resin comprises naphthalene groups and the polyacrylate resin comprises anthracene groups or other chromophore moieties such as phenyl.

A variety of photoresists may be used in combination (i.e. overcoated) with a coating composition of the invention. Preferred photoresists for use with the antireflective compositions of the invention are chemically-amplified resists, especially positive-acting photoresists that contain one or more photoacid generator compounds and a resin component that contains units that undergo a deblocking or cleavage reaction in the presence of photogenerated acid, such as photoacid-labile ester, acetal, ketal or ether units. Negative-acting photoresists also can be employed with coating compositions of the invention, such as resists that crosslink (i.e. cure or harden) upon exposure to activating radiation. Preferred photoresists for use with a coating composition of the invention may be imaged with relatively short-wavelength radiation, e.g. radiation having a wavelength of less than 300 nm or less than 260 nm such as about 248 nm, or radiation having a wavelength of less than about 200 nm or less than about 170 nm, such as about 193 nm or 157 nm.

The invention further provides methods for forming a photoresist relief image and novel articles of manufacture comprising substrates (such as a microelectronic wafer substrate) coated with an antireflective composition of the invention alone or in combination with a photoresist composition.

Other aspects of the invention are disclosed infra.

DETAILED DESCRIPTION OF THE INVENTION

Figure 1:
FIG. 1 shows a SEM of a developed photoresist relief image over an antireflective composition having a polyester resin, of Example 34 which follows.

We now provide new organic coating compositions that are particularly useful with an overcoated photoresist layer. Preferred coating compositions of the invention may be applied by spin-coating (spin-on compositions) and formulated as a solvent composition. The coating compositions of the invention are especially useful as antireflective compositions for an overcoated photoresist and/or as planarizing or via-fill compositions for an overcoated photoresist composition coating layer.

As discussed above, organic coating compositions are provided that contain ester repeat units. The ester groups are not photoacid-labile, i.e. the ester repeat units do not undergo deblocking or other cleavage during typical lithographic processing of pre-exposure bake, exposure to activating radiation, post-exposure heating, and/or development. Preferably, ester repeat units are present in the polymer backbone, i.e. the ester groups (—(C=O)O—) are present on the branched or substantially linear chain that forms the polymer length. Also preferred is that such ester groups contain aromatic substitution, e.g. a phenyl, naphthyl or anthracene group, such as may be provided by reaction of a an alkyl phthalate with a polyol.

Such a polyester resin may contain other repeat units, either as pendant or side chain units, or as other repeat units along the polymer backbone. For example, the resin may be a copolymer (e.g. two distinct repeat units along resin backbone), terpolymer (e.g. three distinct repeat units along resin backbone), tetraplymer (e.g. four distinct repeat units along polymer backbone) or pentapolymer (e.g. five distinct repeat units along polymer backbone). For instance, suitable will be polymers that contain ether and ester repeat units, or alkylene repeat units together with ester and ether units. Additional repeat units that contain one or more oxygen atoms are preferred for many applications.

Exemplary preferred resins that may be utilized in coating compositions of the invention include those that are formed by reaction of a compound that contains one or more carboxyl (e.g. ester, anhydride, carbocyclic acid) groups together with a compound that contains one or more hydroxy group preferably at least two hydroxy groups. The carboxyl-containing compound also preferably may contain two or more carboxyl (—C=OO—) groups. The carboxyl and hydroxy compound are suitably reacted in the presence of acid, optionally with other compounds if copolymer or other higher order polymer is desired, to thereby provide a polyester resin.

Such polyester resins are suitably prepared by charging a reaction vessel with the a polyol, a carboxylate compound, and other compounds to be incorporated into the formed resin, an acid such as a sulfonic acid, e.g. methane sulfonic acid or para-toluene sulfonic acid, and the like. The reaction mixture is suitably stirred at an elevated temperature, e.g. at least about 80° C., more typically at least about 100° C., 110° C., 120° C., 130° C., 140° C., or 150° C. for a time sufficient for polymer formation, e.g. at least about 2, 3, 4, 5, 6, 8, 12, 16, 20, 24 hours. Exemplary preferred conditions for synthesis of useful resins are detailed in the examples which follow.

As discussed above, in a further aspect, the invention provides organic coating compositions, particularly antireflective compositions for use with an overcoated photoresist, are provided that comprise a resin component that is obtained from polymerization of one or more monomers, oligomers or other polymerized subunits or materials that comprise hydroxy groups, e.g. 2, 3, or 4 hydroxy groups per monomer.

Preferably, after reaction of the multi-hydroxy compound to form a composition reaction, the incorporated unit will have at least one, suitably two or three or more unreacted hydroxy groups. Among other things, such hydroxy groups of composition resins can function as sites for crosslinking of an antireflective composition that contains the resin.

As discussed above, multi-hydroxy compounds are suitably reacted to form a polyester resin. However, mutli-hydroxy compounds can be incorporated into other resins and use din antireflective compositions is accordance with the invention, such as a polyether, polyurethane or other resin.

Exemplary hydroxy-containing polymerizable materials include diol, triols and tetraols. Suitable hydroxy-containing polymerizable materials may include other hetero atoms substitution, particularly nitrogen and sulfur, particularly sulfur as may be present as an alkylthio (sulfide), alkylsulfinyl or alkylsulfonyl moiety. Typical multiple hydroxy-containing materials that can be reacted to form a composition resin on the invention have at least two carbon atoms, more typically 3, 4, 5, 6, 7, 8, 9, or 10 carbon atoms. The polymerizable multiple hydroxy-containing materials may be suitably branched or straight-chain compounds.

Specifically suitable diols for reaction to form an antireflective composition resin of the invention include e.g. ethylene glycol; 1,3-propanediol; 1,2-propanediol; 2,2-dimethyl-1,3-propanediol; 2,2-diethyl-1,3-propanediol; 2-ethyl-3-methyl-1,3-propanediol; 2-methyl-2-propyl-1,3-propanediol; 2-butyl-2-ethyl-1,3-propanediol; 1,4-butanediol; 2-methyl-1,4-butanediol; 1,2-butanediol; 1,3-butanediol; 2,3-butanediol; 2,3-dimethyl-2,3-butanediol; 1,5-pentanediol; 1,2-pentanediol; 2,4-pentanediol; 2-methyl-2,4-pentanediol; 1,6-hexandiol; 2,5-hexanediol; 1,2-hexanediol; 1,5-hexanediol; 2-ethyl-1,3-hexanediol; 2,5-dimethyl-2,5-hexanediol; 1,7-heptanediol; 1,8-octanediol; 1,2-octanediol; 1,9-nonanediol; 1,10-decanediol; 1,2-decanediol; 1,12-dodecanediol; 1,2-dodedanediol; 1,2-tetradecanediol; 1,2-hexadecanediol; 1,16-hexadecanediol; 1,2-cyclobutanedimethanol; 1,4-cyclohexanedimethanol; 1,2-cyclohexanedimethanol; 5-norbonene-2,2-dimethanol; 3-cyclohexene-1,1-dimethanol; dicyclohexyl-4,4'-diol; 1,2-cyclopentanediol; 1,3-cyclopentanediol; 1,2-cyclooctanediol; 1,4-cyclooctanediol; 1,5-cylcooctanediol; 1,2-cyclohexanediol; 1,3-cyclohexanediol; 1,4-cyclohexanediol; 1,2-cycloheptanediol; 2,2,4,4-tetramethyl-1,3-cyclobutanediol; 1,2-cyclododecanediol; decahydronaphthalene1,4-diol; decahydronaphthalene-1,5-diol; 3-chloro-1,2-propanediol; 1,4-dibromobutane-2,3-diol; 2,2,3,3-tetrafluorol,4-butanediol; diethylene glycol; triethylene glycol; tetraethylene glycol; pentaethylene glycol; dipropylene glycol; isosorbide; isomannide; 1,3-dioxane-5,5-dimethanol; 1,4-dioxane-2,3-diol; 1,4-dithiane-2,5-diol; 1,2-dithiane-4,5-diol; 2-hydroxyethyldisulfide; 3,6-dithia-1,8-octanediol; 3,3'-thiodipopanol; 2,2'-thiodiethanol; 1,3-hydroxyacetone; 1,5-dihydroxy-2,2,4,4-tetracholoro-3-pentanone; glyceraldehydes; benzopinacole; 1,1,4,4-tetrphenyl-1,4-butanediol; 3,4-bis(p-hydroxyphenol)-3,4-hexanediol; 1,2-benzenedimethanol; 1,4-benaenedimethanol; 2,3,5,6-tetramethyl-p-xylene-α,α'-diol; 2,4,5,6-tetrachlorobenzene-1,3-dimethanol; 2,3,5,6-tetrachlorobenzene-1,4-dimethanol; 2,2-diphenyl-1,3-propanediol; 3-(4-chlorophenoxy)-1,2-propanediol; 2,2'-(p-phenylenedioxy)-diethanol; 5-nitro-m-xylene-α,α'-diol; 1,8-bis(hydroxymethyl)naphthalene; 2,6-bis(hydroxymethyl)-p-cresol; O,O'-bis(2-hydroxyethyl) benzene; 1,2-O-isopropylidenexylofuranose; 5,6-Isopropylideneascorbic acid; 2,3-O-isopropylidenethreitol; and the like.

Specifically suitable triols for reaction to form an antireflective composition resin of the invention include e.g. glycerol; 1,1,1-tris(hydroxymethyl)ethane;

2-hydroxymethyl-1,3-propanediol; 2-ethyl-2-(hydroxymethyl)-1,3-propanediol; 2-hydroxymethy-2-propyl-1,3-propanediol; 2-hydroxymethy-1,4-butanediol; 2-hydroxyethyl-2-methyl-1,4-butanediol; 2-hydroxymethyl-2-propyl-1,4-butanediol; 2-ethyl-2-hydroxyethyl-1,4-butanediol; 1,2,3-butanetriol; 1,2,4-butanetriol; 3-(hydroxymethyl)-3-methyl-1,4-pentanediol; 1,2,5-pentanetriol; 1,3,5-pentanetriol; 1,2,3-trihydroxyhexane; 1,2,6-trihydroxyhexane; 2,5-dimethyl-1,2,6-hexanetriol; tris(hydroxymethyl)nitromethane; 2-methyl-2-nitro-1,3-propanediol; 2-bromo-2-nitro-1,3-propanediol; 1,2,4-cyclopentanetriol; 1,2,3-cylcopentanetriol; 1,3,5-cyclohexanetriol; 1,3,5-cyclohexanetrimethanol; 1,3,5-tris(2-hydroxyethyl)cyanuric acid; 1,2-O-Isopropylideneidofuranose; 1,2-O-isopropylideneglucofuranose; methylxylopyranoside; croconic acid; and the like.

Specifically suitable tetraols for reaction to form an antireflective composition resin of the invention include e.g. 1,2,3,4-butanetetrol; 2,2-bis(hydroxymethyl)-1,3-propanediol; 1,2,4,5-pentanetetrol; tetrahydroxy-1,4-benzoquionone; α-methylmannopyranoside; 2-deoxygalactose; 3-O-methylglucose; ribose; xylose; and the like.

For antireflective applications, suitably one or more of the compounds reacted to form the resin comprise a moiety that can function as a chromophore to absorb radiation employed to expose an overcoated photoresist coating layer. For example, a phthalate compound (e.g. a phthalic acid or dialkyl phthalate (i.e. di-ester such as each ester having 1–6 carbon atoms, preferably a di-methyl or ethyl phthalate) may be polymerized with an aromatic or non-aromatic polyol and optionally other reactive compounds to provide a polyester particularly useful in an antireflective composition employed with a photoresist imaged at sub-200 nm wavelengths such as 193 nm. Similarly, resins to be used in compositions with an overcoated photoresist imaged at sub-300 nm wavelengths or sub-200 nm wavelengths such as 248 nm or 193 nm, a naphthyl compound may be polymerized, such as a naphthyl compound containing one or two or more carboxyl substituents e.g. dialkyl particularly di-$C_{1-6}$alkyl naphthalenedicarboxylate. Reactive anthracene compounds also are preferred, e.g. an anthracene compound having one or more carboxy or ester groups, such as one or more methyl ester or ethyl ester groups.

The compound that contains a chromophore unit also may contain one or preferably two or more hydroxy groups and be reacted with a carboxyl-containing compound. For example, a phenyl compound or anthracene compound having one, two or more hydroxyl groups may be reacted with a carboxyl-containing compound.

Additionally, antireflective compositions may contain a material that contains chromophore units that is separate from the polyester resin component. For instance, the coating composition may comprise a polymeric or non-polymeric compound that contain phenyl, anthracene, naphthyl, etc. units. It is often preferred, however, that the ester-resin contain chromophore moieties.

As mentioned, preferred antireflective coating compositions of the invention can be crosslinked, e.g. by thermal and/or radiation treatment. For example, preferred antireflective coating compositions of the invention may contain a separate crosslinker component that can crosslink with one ore more other components of the antireflective composition. Generally preferred crosslinking antireflective compositions comprise a separate crosslinker component. Particularly preferred antireflective compositions of the invention contain as separate components: a resin, a crosslinker, and a thermal acid generator compound. Additionally, crosslinking antireflective compositions of the invention preferably can also contain an amine basic additive to promote elimination of footing or notching of the overcoated photoresist layer. Crosslinking antireflective compositions are preferably crosslinked prior to application of a photoresist layer over the antireflective coating layer. Thermal-induced crosslinking of the antireflective composition by activation of the thermal acid generator is generally preferred.

Crosslinking antireflective compositions of the invention preferably comprise an ionic or substantially neutral thermal acid generator, e.g. an ammonium arenesulfonate salt, for catalyzing or promoting crosslinking during curing of an antireflective composition coating layer. Typically one or more thermal acid generators are present in an antireflective composition in a concentration from about 0.1 to 10 percent by weight of the total of the dry components of the composition (all components except solvent carrier), more preferably about 2 percent by weight of the total dry components.

As discussed above, antireflective compositions may suitably contain additional resin component. Suitable resin components may contain chromophore units for absorbing radiation used to image an overcoated resist layer before undesired reflections can occur.

For deep UV applications (i.e. the overcoated resist is imaged with deep UV radiation), a polymer of an antireflective composition preferably will absorb reflections in the deep UV range (typically from about 100 to 300 nm). Thus, the polymer preferably contains units that are deep UV chromophores, i.e. units that absorb deep UV radiation. Highly conjugated moieties are generally suitable chromophores. Aromatic groups, particularly polycyclic hydrocarbon or heterocyclic units, are typically preferred deep UV chromophore, e.g. groups having from two to three to four fused or separate rings with 3 to 8 members in each ring and zero to three N, O or S atoms per ring. Such chromophores include optionally substituted phenanthryl, optionally substituted anthracyl, optionally substituted acridine, optionally substituted naphthyl, optionally substituted quinolinyl and ring-substituted quinolinyls such as hydroxyquinolinyl groups. Optionally substituted anthracenyl groups are particularly preferred for 248 nm imaging of an overcoated resist. Preferred antireflective composition resins have pendant anthracene groups. Preferred resins include those of Formula I as disclosed on page 4 of European Published Application 813114A2 of the Shipley Company.

Another preferred resin binder comprises optionally substituted quinolinyl groups or a quinolinyl derivative that has one or more N, O or S ring atoms such as a hydroxyquinolinyl. The polymer may contain other units such as carboxy and/or alkyl ester units pendant from the polymer backbone. A particularly preferred antireflective composition resin in an acrylic containing such units, such as resins of formula II disclosed on pages 4–5 of European Published Application 813114A2 of the Shipley Company.

For imaging at 193 nm, the antireflective composition preferably may contain a resin that has phenyl chromophore units. For instance, one suitable antireflective resin for use with photoresists imaged at 193 nm is a terpolymer consisting of polymerized units of styrene, 2-hydroxyethylmethacrylate and methylmethacrylate (30:38:32 mole ratio). Such phenyl group containing resins and use of same in antireflective compositions have been disclosed in U.S. application Ser. No. 09/153,575, file 1998 and corresponding European Published Application EP87600A1, assigned to the Shipley Company.

As discussed above, particularly preferred chromophore include optionally substituted aryl dicarboxylate moieties, particularly optionally substituted carbocyclic aryl moieties such as phenyl or naphthyl dicarboxylate groups such as may be present as a group on a resin (either backbone unit or side chain) or a small molecule (MW less than about 1000 or 500) component. It has been found that naphthylene dicarboxylates can be highly effective to absorb undesired reflections of exposure radiation of an overcoated photoresist. Such aryl dicarboxylate groups may be includes in a coating composition of the invention by a variety of approaches. For instance, a resin may be employed (may or may not have ester repeat units that comprises naphthyl dicarboxylate units. For instance, an acrylate having a naphthyl dicarboxylate group (e.g. one of the carboxylate groups forming the ester moiety of the acrylate) may be polymerized with other monomers to provide a resin with naphthyl dicarboxylate moieties. A naphthylene substituted at 2 and 6 positions by carboxylate groups is particularly suitably, although carboxylate substitution at other naphthyl ring positions also will be suitable.

Such coating compositions comprising a resin or other component are employed as described above. Thus, for example, the composition may suitably comprise a crosslinker and an acid source such as an acid or acid generator compound particularly a thermal acid generator compound whereby the applied coating composition can be crosslinked such as by thermal treatment prior to application of an overcoated photoresist layer.

Preferably resins of antireflective compositions of the invention will have a weight average molecular weight (Mw) of about 1,000 to about 10,000,000 daltons, more typically about 5,000 to about 1,000,000 daltons, and a number average molecular weight (Mn) of about 500 to about 1,000,000 daltons. Molecular weights (either Mw or Mn) of the polymers of the invention are suitably determined by gel permeation chromatography.

While coating composition resins having absorbing chromophores are generally preferred, antireflective compositions of the invention may comprise other resins either as a co-resin or as the sole resin binder component. For example, phenolics, e.g. poly(vinylphenols) and novolaks, may be employed. Such resins are disclosed in the incorporated European Application EP 542008 of the Shipley Company. Other resins described below as photoresist resin binders also could be employed in resin binder components of antireflective compositions of the invention.

The concentration of such a resin component of the coating compositions of the invention may vary within relatively broad ranges, and in general the resin binder is employed in a concentration of from about 50 to 95 weight percent of the total of the dry components of the coating composition, more typically from about 60 to 90 weight percent of the total dry components (all components except solvent carrier).

As discussed above, crosslinking-type coating compositions of the invention also contain a crosslinker component. A variety of crosslinkers may be employed, including those antireflective composition crosslinkers disclosed in Shipley European Application 542008 incorporated herein by reference. For example, suitable antireflective composition crosslinkers include amine-based crosslinkers such as melamine materials, including melamine resins such as manufactured by American Cyanamid and sold under the tradename of Cymel 300, 301, 303, 350, 370, 380, 1116 and 1130. Glycolurils are particularly preferred including glycolurils available from American Cyanamid. Benzoquanamines and urea-based materials also will be suitable including resins such as the benzoquanamine resins available from American Cyanamid under the name Cymel 1123 and 1125, and urea resins available from American Cyanamid under the names of Beetle 60, 65, and 80. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

Suitable substantially neutral crosslinkers include hydroxy compounds, particularly polyfunctional compounds such as phenyl or other aromatics having one or more hydroxy or hydroxy alkyl substitutents such as a $C_{1-8}$hydroxyalkyl substitutents. Phenol compounds are generally preferred such as di-methanolphenol ($C_6H_3(CH_2OH)_2)H$) and other compounds having adjacent (within 1–2 ring atoms) hydroxy and hydroxyalkyl substitution, particularly phenyl or other aromatic compounds having one or more methanol or other hydroxylalkyl ring substituent and at least one hydroxy adjacent such hydroxyalkyl substituent.

It has been found that a substantially neutral crosslinker such as a methoxy methylated glycoluril used in antireflective compositions of the invention can provide excellent lithographic performance properties.

A crosslinker component of antireflective compositions of the invention in general is present in an amount of between about 5 and 50 weight percent of total solids (all components except solvent carrier) of the antireflective composition, more typically in an amount of about 7 to 25 weight percent total solids.

Coating compositions of the invention, particularly for reflection control applications, also may contain additional dye compounds that absorb radiation used to expose an overcoated photoresist layer. Other optional additives include surface leveling agents, for example, the leveling agent available under the tradename Silwet 7604 from Union Carbide, or the surfactant FC 171 or FC 431 available from the 3M Company.

Coating compositions of the invention also may contain one or more photoacid generator compound typically in addition to another acid source such as an acid or thermal acid generator compound. In such use of a photoacid generator compound (PAG), the photoacid generator is not used as an acid source for promoting a crosslinking reaction, and thus preferably the photoacid generator is not substantially activated during crosslinking of the coating composition (in the case of a crosslinking coating composition). Such use of photoacid generators is disclosed in U.S. Pat. No. 6,261,743 assigned to the Shipley Company. In particular, with respect to coating compositions that are thermally crosslinked, the coating composition PAG should be substantially stable to the conditions of the crosslinking reaction so that the PAG can be activated and generate acid during subsequent exposure of an overcoated resist layer. Specifically, preferred PAGs do not substantially decompose or otherwise degrade upon exposure of temperatures of from about 140 or 150 to 190° C. for 5 to 30 or more minutes.

Generally preferred photoacid generators for such use in antireflective compositions or other coating of the invention include e.g. onium salts such as di(4-tert-butylphenyl)

iodonium perfluoroctane sulphonate, halogenated non-ionic photoacid generators such as 1,1-bis[p-chlorophenyl]-2,2,2-trichloroethane, and other photoacid generators disclosed for use in photoresist compositions. For at least some antireflective compositions of the invention, antireflective composition photoacid generators will be preferred that can act as surfactants and congregate near the upper portion of the antireflective composition layer proximate to the antireflective composition/resist coating layers interface. Thus, for example, such preferred PAGs may include extended aliphatic groups, e.g. substituted or unsubstituted alkyl or alicyclic groups having 4 or more carbons, preferably 6 to 15 or more carbons, or fluorinated groups such as $C_{1-15}$alkyl or $C_{2-15}$alkenyl having one or preferably two or more fluoro substituents.

To make a liquid coating composition of the invention, the components of the coating composition are dissolved in a suitable solvent such as, for example, one or more oxyisobutyric acid esters particularly methyl-2-hydroxyisobutyrate as discussed above, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. A preferred solvent for an antireflective coating composition of the invention is methyl-2-hydroxyisobutyrate, optionally blended with anisole. The concentration of the dry components in the solvent will depend on several factors such as the method of application. In general, the solids content of an antireflective composition varies from about 0.5 to 20 weight percent of the total weight of the coating composition, preferably the solids content varies from about 2 to 10 weight of the coating composition.

A variety of photoresist compositions can be employed with coating compositions of the invention, including positive-acting and negative-acting photoacid-generating compositions. Photoresists used with antireflective compositions of the invention typically comprise a resin binder and a photoactive component, typically a photoacid generator compound. Preferably the photoresist resin binder has functional groups that impart alkaline aqueous developability to the imaged resist composition.

As discussed above, particularly preferred photoresists for use with antireflective compositions of the invention are chemically-amplified resists, particularly positive-acting chemically-amplified resist compositions, where the photoactivated acid in the resist layer induces a deprotection-type reaction of one or more composition components to thereby provide solubility differentials between exposed and unexposed regions of the resist coating layer. A number of chemically-amplified resist compositions have been described, e.g., in U.S. Pat. Nos. 4,968,581; 4,883,740; 4,810,613; 4,491,628 and 5,492,793, al of which are incorporated herein by reference for their teaching of making and using chemically amplified positive-acting resists. Coating compositions of the invention are particularly suitably used with positive chemically-amplified photoresists that have acetal groups that undergo deblocking in the presence of a photoacid. Such acetal-based resists have been described in e.g. U.S. Pat. Nos. 5,929,176 and 6,090,526.

The antireflective compositions of the invention also may be used with other positive resists, including those that contain resin binders that comprise polar functional groups such as hydroxyl or carboxylate and the resin binder is used in a resist composition in an amount sufficient to render the resist developable with an aqueous alkaline solution. Generally preferred resist resin binders are phenolic resins including phenol aldehyde condensates known in the art as novolak resins, homo and copolymers or alkenyl phenols and homo and copolymers of N-hydroxyphenyl-maleimides.

Preferred positive-acting photoresists for use with an underlying coating composition of the invention contains an imaging-effective amount of photoacid generator compounds and one or more resins that are selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793, incorporated herein by reference; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997, incorporated herein by reference; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526, incorporated herein by reference.

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664, incorporated herein by reference; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462, all incorporated herein by reference, and iii) polymers that contain polymerized anhydride units, particularly polymerized maleic anhydride and/or itaconic anhydride units, such as disclosed in European Published Application EP01008913A1 and U.S. Pat. No. 6,048,662, both incorporated herein by reference.

3) a resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in PCT/US01/14914 and U.S. application Ser. No. 09/567,634.

4) a resin that contains fluorine substitution (fluoropolymer), e.g. as may be provided by polymerization of tetrafluoroethylene, a fluorinated aromatic group such as fluoro-styrene compound, and the like. Examples of such resins are disclosed e.g. in PCT/US99/21912.

Suitable photoacid generators to employ in a positive or negative acting photoresist overcoated over a coating composition of the invention include imidosulfonates such as compounds of the following formula:

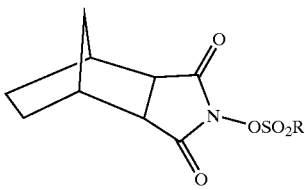

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs for resists overcoated a coating composition of the invention, particularly sulfonate salts. Two suitable agents for 193 nm and 248 nm imaging are the following PAGS 1 and 2:

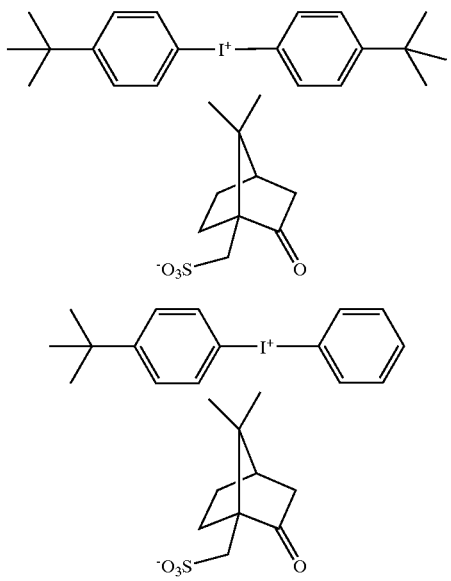

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3^-$— where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known PAGS also may be employed in the resists of the invention.

A preferred optional additive of photoresists overcoated a coating composition of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Preferred negative-acting resist compositions for use with an overcoated coating composition of the invention comprise a mixture of materials that will cure, crosslink or harden upon exposure to acid, and a photoacid generator.

Particularly preferred negative-acting resist compositions comprise a resin binder such as a phenolic resin, a crosslinker component and a photoactive component of the invention. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycoluril resins are sold by American Cyanamid under trade names Cymel 1170, 1171, 1172, Powderlink 1174, urea-based resins are sold under the tradenames of Beetle 60, 65 and 80, and benzoguanamine resins are sold under the trade names of Cymel 1123 and 1125.

Suitable photoacid generator compounds of resists used with antireflective compositions of the invention include the onium salts, such as those disclosed in U.S. Pat. Nos. 4,442,197, 4,603,10, and 4,624,912, each incorporated herein by reference; and non-ionic organic photoactive compounds such as the halogenated photoactive compounds as in U.S. Pat. No. 5,128,232 to Thackeray et al. and sulfonate photoacid generators including sulfonated esters and sulfonlyoxy ketones. See J. of Photopolymer Science and Technology, 4(3):337–340 (1991), for disclosure of suitable sulfonate PAGS, including benzoin tosylate, t-butylphenyl alpha-(p-toluenesulfonyloxy)-acetate and t-butyl alpha(p-toluenesulfonyloxy)-acetate. Preferred sulfonate PAGs are also disclosed in U.S. Pat. No. 5,344,742 to Sinta et al. The above camphorsulfoanate PAGs 1 and 2 are also preferred photoacid generators for resist compositions used with the antireflective compositions of the invention, particularly chemically-amplified resists of the invention.

Photoresists for use with an antireflective composition of the invention also may contain other materials. For example, other optional additives include actinic and contrast dyes, anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 50 percent by weight of the total weight of a resist's dry components.

Various substituents and materials (including resins, small molecule compounds, acid generators, etc.) as being "optionally substituted" may be suitably substituted at one or more available positions by e.g. halogen (F, Cl, Br, I); nitro; hydroxy; amino; alkyl such as $C_{1-8}$ alkyl; alkenyl such as $C_{2-8}$ alkenyl; alkylamino such as $C_{1-8}$ alkylamino; carbocyclic aryl such as phenyl, naphthyl, anthracenyl, etc; and the like.

In use, a coating composition of the invention is applied as a coating layer to a substrate by any of a variety of methods such as spin coating. The coating composition in general is applied on a substrate with a dried layer thickness of between about 0.02 and 0.5 μm, preferably a dried layer thickness of between about 0.04 and 0.20 μm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed.

Preferably the applied coating layer is cured before a photoresist composition is applied over the antireflective composition. Cure conditions will vary with the components of the antireflective composition. Particularly the cure temperature will depend on the specific acid or acid (thermal) generator that is employed in the coating composition. Typical cure conditions are from about 80° C. to 225° C. for about 0.5 to 40 minutes. Cure conditions preferably render the coating composition coating layer substantially insoluble to the photoresist solvent as well as an alkaline aqueous developer solution.

After such curing, a photoresist is applied over the surface of the coating composition. As with application of the bottom coating composition, the overcoated photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the bottom composition layer and overcoated photoresist layer should occur.

The resist layer is then imaged with activating radiation through a mask in a conventional manner. The exposure energy is sufficient to effectively activate the photoactive component of the resist system to produce a patterned image in the resist coating layer. Typically, the exposure energy ranges from about 3 to 300 $mJ/cm^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The exposed resist coating layer is then developed, preferably with an aqueous based developer such as an alkali exemplified by tetra butyl ammonium hydroxide, sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures. Following development, a final bake of an acid-hardening photoresist is often employed at temperatures of from about 100° C. to about 150° C. for several minutes to further cure the developed exposed coating layer areas.

The developed substrate may then be selectively processed on those substrate areas bared of photoresist, for example, chemically etching or plating substrate areas bared of photoresist in accordance with procedures well known in the art. Suitable etchants include a hydrofluoric acid etching solution and a plasma gas etch such as an oxygen plasma etch. A plasma gas etch removes the antireflective coating layer.

The following non-limiting examples are illustrative of the invention. All documents mentioned herein are incorporated herein by reference.

EXAMPLES 1–24

Resin Syntheses

In each of the following Examples 1 through 16, all reagents were initially charged into the reactor with little regard to the order of addition. The reaction setup consisted of either a 100-mL (Examples 1–3, 7, 8, 10, 12–16 and 20–24) or a 250-mL (Examples 4–6, 9, 11, 17–19) three-neck, round-bottom flask fitted with a mechanical stirrer, temperature control box, temperature probe, heating mantle, condenser, Dean-Stark trap, and nitrogen purge inlet (sweep). Each of the reactions was heated to the time and temperature indicated in Table 1 below. GPC was performed on all polymer samples and solutions as indicated in Table 1 below. All solid polymers were collected by filtration in a Buchner funnel, air-dried, and then dried in vacuo between 40–70° C. For one-pot preparation, the molten polymers were dissolved in solvents favorable to formulation. The percent solutions were based on the theoretical yield.

EXAMPLE 1

Polymer Particularly Suitable for 193 nm ARC

Charge: dimethyl nitroterephthalate (12.48 g, 52.17 mmol), dimethyl 1,4-cyclohexanedicarboxylate (4.91 g, 24.5 mmol), dimethyl phthalate (2.34 g, 12.0 mmol), dimethyl isophthalate (2.34 g, 12.0 mmol), isosorbide (5.86 g, 40.1 mmol), glycerol (2.81 g, 30.5 mmol), p-toluenesulfonic acid monohydrate (PTSA) (0.26 g, 1.4 mmol) and toluene (20 mL). The resultant polymer was dissolved in tetrahydrofuran (THF), and precipitated in mixture of t-butylmethyl ether (MTBE) and hexanes to obtain 11.6 g (42%).

EXAMPLE 2

Polymer Particularly Suitable for 193 nm ARC

Charge: dimethyl isophthalate (18.52 g, 95.37 mmol), dimethyl phthalate (2.33 g, 12.0 mmol), 1,3,5-tris(2-hydroxyethyl)cyanuric acid (15.63 g, 59.39 mmol), glycerol (4.80 g, 52.1 mmol), and PTSA (0.54 g, 2.8 mmol). The resultant polymer was dissolved in THF. The polymer could be precipitated from water, isopropanol (IPA), or MTBE. Collectively, 26 g (70%) of polymer was obtained.

EXAMPLE 3

Polymer Particularly Suitable for 193 nm ARC

Charge: dimethyl nitroterephthalate (18.26 g, 76.34 mmol), dimethyl isophthalate (2.33 g, 12.0 mmol), dimethyl phthalate (2.33 g, 12.0 mmol), 1,3,5-tris(2-hydroxyethyl) cyanuric acid (15.91 g, 60.91 mmol), glycerol (5.58 g, 60.6 mmol), and PTSA (0.55 g, 2.9 mmol). The resultant polymer was dissolved in THF, and precipitated in MTBE to obtain 26 g (69%).

EXAMPLE 4

Polymer Particularly Suitable for 193 nm ARC

Charge: dimethyl nitroterephthalate (45.5 g, 190 mmol), dimethyl isophthalate (5.8 g, 30 mmol), dimethyl phthalate (5.8 g, 30 mmol), 1,3,5-tris(2-hydroxylethyl)cyanuric acid (39.2 g, 150 mmol), glycerol (14.3 g, 155 mmol), and PTSA (1.1 g, 5.8 mmol). The resultant polymer was dissolved in enough methyl 2-hydroxyisobutyrate (HBM) to prepare a 9.5% solution.

EXAMPLE 5

Polymer Particularly Suitable for 193 nm ARC

Charge: dimethyl nitroterephthalate (58.7 g, 245 mmol), glycerol (27.1 g, 294 mmol), and para-toluene sulfonic acid monohydrate (PTSA) (0.57 g, 3.0 mmol). Enough methyl 2-hydroxyisobutyrate (HBM) was added to prepare an 11% solution.

EXAMPLE 6

Polymer Particularly Suitable for 193 nm ARC and 248 nm ARC

Charge: dimethyl terephthalate (48.5 g, 250 mmol), ethylene glycol (12.4 g, 200 mmol), glycerol (9.0 g, 100 mmol), and PTSA (0.54 g, 2.8 mmol). Enough propylene glycol methyl ether acetate (PMA) was added to prepare an 8% solution.

EXAMPLE 7

Polymer Particularly Suitable for 248 nm ARC

Charge: dimethyl 2,6-naphthalenedicarboxylate (24.33 g, 99.63 mmol), dimethylterephthalate (19.44 g, 100.1 mmol), ethylene glycol (7.63 g, 123 mmol), glycerol (7.29 g, 79.2 mmol), and PTSA (0.46 g, 2.4 mmol). The resultant polymer was dissolved in a solvent mixture of HBM, anisole, and methyl 2-methoxyisobutyrate (MBM) to prepare a 10% solution.

EXAMPLE 8

Polymer Particularly Suitable for 248 nm ARC

Charge: dimethyl 2,6-naphthalenedicarboxylate (30.5 g, 125 mmol), dimethylterephthalate (14.5 g, 74.7 mmol), ethylene glycol (7.20 g, 116 mmol), glycerol (7.30 g, 79.3 mmol) and PTSA (0.47 g, 2.5 mmol). The resultant polymer was dissolved in a mixture of anisole and tetrahydrofurfuryl alcohol to prepare a 10% solution.

EXAMPLE 9

Polymer Particularly Suitable for 248 ARC

Charge: dimethyl 2,6-naphthalenedicarboxylate (47.70 g, 195.3 mmol), dimethyl terephthalate (25.90 g, 133.4 mmol), glycerol (32.90 g, 357.2 mmol), PTSA (0.84 g, 4.4 mmol), and anisole (36 g). The resultant polymer was dissolved in a mixture of methyl-2-hydroxyisobutyrate (HBM) and anisole to prepare 10% solution.

EXAMPLE 10

Polymer Particularly Suitable for 248 nm ARC

Charge: dimethyl 2,6-naphthalenedicarboxylate (25.61 g, 104.8 mmol), dimethyl terephtalate (13.58 g, 69.93 mmol), glycerol (16.72 g, 181.5 mmol), PTSA (0.45 g, 2.4 mmol), and anisole (18.8 g). The resultant polymer was dissolve in THF and precipitated in IPA to obtain 36.9 g (83%).

EXAMPLE 11

Polymer Particularly Suitable for 193 nm ARC

Charge: dimethyl nitroterephthalate (31.78 g, 132.9 mmol), dimethyl isophthalate (4.09 g, 21.1 mmol), and dimethyl phthalate (4.10 g, 21.1 mmol), 1,3,5-tris (2-hydroxyethyl)cyanuric acid (27.42 g, 105.0 mmol), gylcerol (9.65 g, 105 mmol), PTSA (0.65 g, 3.4 mmol), and anisole (25 g). The resultant polymer was dissolved in THF and precipitated in MTBE to obtain 47.2 g (72%).

EXAMPLE 12

Polymer Particularly Suitable for 193 nm ARC

Charge: dimethyl nitroterephthalate (16.7 g, 70.0 mmol), dimethyl terephthalate (34.9 g, 180 mmol), ethylene glycol (7.80 g, 126 mmol), glycerol (13.8 g, 150 mmol), PTSA (0.28 g, 1.5 mmol), and anisole (8 g). The resultant polymer was dissolved in enough HBM to prepare a 10% solution.

EXAMPLE 13

Polymer Particularly Suitable for 248 nm ARC

Charge: dimethyl naphthalenedicarboxylate (16.82 g, 68.88 mmol), dimethyl terephthalate (8.91 g, 45.9 mmol), glycerol (10.99 g, 119 mmol), PTSA (0.44 g, 2.3 mmol), and anisole (37 g). The resultant polymer was dissolved in a solvent mixture of HBM and anisole to prepare a 6.5% solution. The residual monomer content was filtered out of solution by passing through a Buchner funnel.

EXAMPLE 14

Polymer Particularly Suitable for 248 nm ARC

Charge: dimethyl naphthalenedicarboxylate (30.48 g, 124.8 mmol), glycerol (11.96 g, 12.9.9 mmol), PTSA (0.69 g, 3.6 mmol), and anisole (43 g). The resultant polymer was dissolved in a solvent mixture of propylene glycol methyl ether alcohol (PM) and anisole to prepare an 18.4% solution.

EXAMPLE 15

Polymer Particularly Suitable for 248 nm ARC

Charge: dimethyl naphthalenedicarboxylate (32.46 g, 132.9 mmol), dimethyl isophthalate (3.20 g, 16.5 mmol), dimethyl phthalate (3.25 g, 16.7 mmol), glycerol (15.96 g, 173.3 mmol), PTSA (0.44 g, 2.3 mmol), and anisole (38 g). The resultant polymer was dissolved in a solvent mixture of PM and anisole to prepare a 21.1% solution.

EXAMPLE 16

Polymer Particularly Suitable for 248 nm ARC

Charge: dimethyl naphthalenedicarboxylate (25.59 g, 104.7 mmol), dimethyl terephthalate (13.57 g, 69.88 mmol), glycerol (15.32 g, 166.3 mmol), dodecylbenzenesulfonic acid (DDBSA) (0.91 g, 2.8 mmol), and anisole (19 g). The resultant polymer was dissolved in a mixture of PM and anisole to prepare a 22.3% solution.

EXAMPLE 17

Polymer Particularly Suitable for 248 nm ARC

Charge: 2,6-Naphthalenedicarboxylate (61.1 g, 250 mmol), tris(hydroxymethyl)ethane (30.0 g, 250 mmol), PTSA (10.2 g, 53.6 mmol), and anisole (68 g). The resultant polymer was diluted to 25% solution with HBM and precipitated in IPA to obtain 64.1 g (85%).

EXAMPLE 18

Polymer Particularly Suitable for 193 nm ARC

Charge: dimethyl terephthalate (31.15 g, 16.04 mmol), 1,3,5-tris(2-hydroxyethyl)cyanuric acid (46.09 g, 17.64 mmol), PTSA (1.35 g, 0.710 mmol), and anisole (52 g). The resultant polymer was diluted to 25% solution with HBM and precipitated in IPA to obtain 45.3 g (67%).

EXAMPLE 19

Polymer Particularly Suitable for 193 nm ARC

Charge: dimethyl nitroterephthalate (63.53 g, 265.6 mmol), dimethyl isophthalate (8.15 g, 42.0 mmol), dimethyl phthalate (8.27 g, 42.6 mmol), 1,3,5-tris (2-hydroxyethyl) cyanuric acid (54.90 g, 210.2 mmol), gylcerol (19.32 g, 209.8 mmol), and PTSA (1.31 g, 6.89 mmol). The resultant polymer was dissolved in THF and precipitated in MTBE to obtain 97.5 g (74%).

EXAMPLE 20

Polymer Particularly Suitable for 193 nm ARC

Charge: dimethyl nitroterephthalate (27.23 g, 113.8 mmol), dimethyl isophthalate (3.65 g, 18.8 mmol), dimethyl phthalate (3.37 g, 17.4 mmol), 1,3,5-tris (2-hydroxyethyl) cyanuric acid (43.12 g, 165.1 mmol), and PTSA (0.68 g, 3.6 mmol). The resultant polymer was dissolved in THF and precipitated in MTBE to obtain 62.6 g (92%).

EXAMPLE 21

Polymer Particularly Suitable for 193 nm ARC

Charge: dimethyl nitroterephthalate (35.80 g, 149.7 mmol), 1,3,5-tris (2-hydroxyethyl)cyanuric acid (43.07 g, 164.9 mmol), and PTSA (0.69 g, 3.6 mmol). The resultant polymer was dissolved in THF and precipitated in IPA to obtain 53.2 g (77%).

EXAMPLE 22

Polymer Particularly Suitable for 193 nm ARC

Charge: dimethyl nitroterephthalate (11.08 g, 46.32 mmol), dimethyl 5-nitroisophthalate (24.73 g, 103.4 mmol), 1,3,5-tris (2-hydroxyethyl)cyanuric acid (43.06 g, 164.9 mmol), and PTSA (0.69 g, 3.6 mmol). The resultant polymer was dissolved in THF and precipitated in IPA to obtain 53.4 g (77%).

EXAMPLE 23

Polymer Particularly Suitable for 193 nm ARC

Charge: dimethyl terephthalate (31.11 g, 160.2 mmol), 1,3,5-tris (2-hydroxyethyl)cyanuric acid (45.80 g, 175.3 mmol), and PTSA (0.67 g, 3.5 mmol). The resultant polymer was dissolved in THF and precipitated in MTBE to obtain 50.0 g (75%).

EXAMPLE 24

Polymer Particularly Suitable for 193 nm ARC

Charge: dimethyl phthalate (30.91 g, 159.2 mmol), 1,3,5-tris(2-hydroxyethyl)cyanuric acid (46.06 g, 176.3 mmol), and PTSA (0.67 g, 3.5 mmol). The resultant polymer was dissolved in THF and precipitated in MTBE to obtain 51.1 g (76%).

TABLE 1

Reaction Conditions and Results for Synthetic Examples.

| Example | Rxn Temp (° C.) | Rxn Time (hours) | Mw (RI) | Mn (RI) | PDI |
|---|---|---|---|---|---|
| 1 | 170–200 | 14 | 2475 | 1517 | 1.63 |
| 2 | 160 | 12 | 7921 | 2709 | 2.92 |
| 3 | 150 | 12 | 4552 | 2066 | 2.20 |
| 4 | 140–145 | 20 | 1715 | 1021 | 1.68 |
| 5 | 134–142 | 48 | 1475 | 1079 | 1.37 |
| 6 | 145–150 | 15 | 5205 | 1909 | 2.73 |
| 7 | 150–200 | 4 | 4065 | 1782 | 2.28 |
| 8 | 160 | 15 | 8638 | 2318 | 3.72 |
| 9 | 150–160 | 5.5 | 1225 (UV) | 425 (UV) | 2.88 |
| 10 | 150–160 | 13 | 16,459 | 3902 | 4.22 |
| 11 | 145–155 | 14 | 29,067 | 3785 | 7.68 |
| 12 | 140–150 | 23 | 2066 | 1137 | 1.82 |
| 13 | 150 | 18 | 2321 | 1298 | 1.78 |
| 14 | 150 | 24 | 11,025 | 2243 | 4.91 |
| 15 | 150 | 12 | 5424 | 1913 | 2.83 |
| 16 | 150 | 15.5 | 5464 | 2010 | 2.71 |
| 17 | 150 | 3.3 | 5958 | 2703 | 2.20 |
| 18 | 150 | 7 | 4355 | 2201 | 1.97 |
| 19 | 150 | 12 | 2772 | 1656 | 1.67 |
| 20 | 150 | 7.25 | 4118 | 2033 | 2.03 |
| 21 | 150 | 7.25 | 2745 | 1633 | 1.68 |
| 22 | 150 | 3 | 2472 | 1561 | 1.58 |
| 23 | 150 | 2 | 3562 | 2056 | 1.73 |
| 24 | 150 | 8 | 2849 | 1772 | 1.61 |

EXAMPLES 25–41

Polymer Evaluations

Polymers of the above Examples were further characterized for either optical density (OD) (Table 2 below), solvent resistance (Table 3 below), oxide etch-rate (Table 4 below), or optical parameters (Table 5 below). Examples 25–41 illustrate the unique formulation as they relate to the test(s) performed.

Each of the formulated samples was prepared by charging the indicated components into a clean bottle without regard to order of charge. The samples were shaken or placed on rollers until completely dissolved. Each sample was then passed through a 0.2 μm PTFE membrane filter into a clean bottle.

For all wafers (silicon or quartz) spin-coated with the formulated samples, the spin time was 30 seconds, and the spin-speeds varied as indicated in the corresponding tables. Then the wafers were baked on a hotplate for 60 seconds at the temperature indicated in the table. The thickness of the films on silicon wafers was measured by ellipsometry.

General Procedures for OD Determination

For OD measurements, the formulated samples were coated onto both silicon and quartz wafers. The thickness of the films on silicon was measured. The absorptivity of the films on quartz was determined by UV spectrophotometry. The absorptivity was measured against a blank quartz wafer. From the thickness and absorptivity measurements, the OD was calculated at the corresponding wavelengths indicated in Table 2.

General Procedures for Measuring Solvent Resistance

Each sample solution tested for solvent resistance was spin-coated onto a silicon wafer. The thickness of the wafer was measured using ellipsometry. Ethyl lactate (EL), a solvent commonly used in the photoresist art, was then poured over the surface of the wafer and allowed to sit for 60 seconds. The wafer was then spun dry at 4000 rpm for 60 seconds. The thickness was measured again and the difference is reported in Table 3 below.

General Procedures for Measuring Etch-Rate

Each sample solution tested for etch was spin-coated onto two silicon wafers, and the films were measured for thickness. The films were then subject to oxide etch (Honeywell) for 30 seconds. The thickness of the etched films was then measured, and differences were averaged to calculate the rates reported in Table 4.

General Procedures for Measuring Optical Parameters

Each sample solution tested for optical parameters was spin-coated onto a silicon wafer. Ellipsometric techniques were applied to determine the real (n) and imaginary (k) refractive indices. The results are reported in Table 5.

EXAMPLE 25

Formulation: polymer from Example 1 (1 g) and PM (19 g). The sample was tested for OD.

EXAMPLE 26

Formulation: polymer prepared in Example 2 (1.237 g), tetramethoxygyclouril crosslinker (TMG) (0.234 g), plasticizer (0.301 g), PTSA (0.0054 g), photoacid generator (0.0090 g), surfactant (0.0126 g), and HBM (28.2 g). The sample was tested for etch.

EXAMPLE 27

Formulation: polymer from Example 2 (0.466 g), HBM (9.57 g), TMG (0.121 g), and PTSA (0.0075 g). The sample was tested for solvent resistance, etch, and optical parameters.

EXAMPLE 28

Formulation: polymer prepared in Example 3 (0.474 g), HBM (9.67 g), TMG (0.137 g), and PTSA (0.0070 g). The sample was tested for solvent resistance, etch, and optical parameters.

EXAMPLE 29

Formulation: polymeric solution prepared in Example 4 (4.28 g), HBM (5.62 g), and TMG (0.10 g). The sample was tested for OD and solvent resistance.

EXAMPLE 30

Formulation: polymeric solution prepared in Example 5 (3.66 g), HBM (6.25 g) TMG (0.10 g). The sample was tested for OD, solvent resistance, and optical parameters.

EXAMPLE 31

Formulation: polymeric solution prepared in Example 6 (4.62 g), PMA (5.26 g), and TMG (0.12 g). The sample was tested for OD, solvent resistance, etch, and optical parameters.

EXAMPLE 32

Formulation: polymeric solution prepared in Example 5 (4.00 g), polymeric solution prepared in example 6 (4.50 g), HBM (11.32 g), and TMG (0.20 g). The sample was tested for OD, solvent resistance, etch, and optical parameters

EXAMPLE 33

Formulation: polymeric solution prepared in Example 7 (7.99 g), TMG (0.20 g), HBM (1.8 g), PMA (5.0 g), and anisole (5.0 g). The sample was tested for OD and solvent resistance.

EXAMPLE 34

Formulation: the polymeric solution prepared in Example 8 (8.02 g), TMG (0.20 g), anisole (8.19 g), and tetrahydrofurfuryl alcohol (3.60 g). The sample was tested for OD and solvent resistance.

EXAMPLE 35

Formulation: polymeric solution prepared in Example 9 (4.00 g), HBM (20.90 g), and TMG (0.10 g). The sample was tested for OD and solvent resistance.

EXAMPLE 36

Amberlite IRN-150 (5 g) was added to the polymer solution prepared in Example 9 (200 g). The sample was placed on rollers for 24 h, and the ion-exchange resin was removed from solution by filtration. The sample (4.0 g) was used in formulation with HBM (20 g) and TMG (0.10 g). The sample was tested for solvent resistance.

EXAMPLE 37

Formulation: polymeric solution prepared in Example 9 (12.00 g), HBM (17.71 g), and TMG (0.30 g). The sample was tested for etch.

EXAMPLE 38

Formulation: polymer sample prepared in Example 10 (0.400 g), anisole (6.13 g), tetrahydrofurfuryl alcohol (8.09 g), HBM (10.29 g), PTSA (2.5 mg), and TMG (0.100 g). The sample was tested for solvent resistance.

EXAMPLE 39

Formulation: polymeric solution prepared in Example 12 (12.0 g), HBM (7.4 g), TMG (0.6 g), and PTSA (60 mg). The sample was tested for etch.

EXAMPLE 40

Formulation: polymeric solution prepared in Example 14 (4.8 g), PM (7.0 g), anisole (8.0 g), and TMG (0.24 g). The sample was tested for etch.

EXAMPLE 41

Formulation: polymeric solution prepared in example 16 (4.8 g), PM (12.4 g), anisole (2.6 g), and TMG (0.24 g). The sample was tested for solvent resistance.

TABLE 2

Optical Density

| Example | Polymer | Spin-speed (rmp) | Bake temp (C.) | Wavelength (nm) | OD (1/μm) |
|---|---|---|---|---|---|
| 25 | 1 | 2400 | 105 | 193 | 9.1 |
| 29 | 4 | 2400 | 180 | 193 | 105 |
| 30 | 5 | 2400 | 180 | 193 | 9.0 |
| 31 | 6 | 2400 | 180 | 193 | 14.2 |
| 31 | 6 | 2400 | 180 | 248 | 6.8 |
| 32 | 5, 6 | 3600 | 180 | 193 | 12.5 |
| 33 | 7 | 3600 | 180 | 248 | 11.1 |
| 34 | 8 | 3600 | 180 | 248 | 12.5 |
| 35 | 9 | 2400 | 205 | 248 | 10.6 |

TABLE 3

Solvent Resistance

| Example | Polymer | Spin-speed (rpm) | Bake temp (° C.) | Thickness Change (Angstroms) |
|---|---|---|---|---|
| 27 | 2 | 2400 | 150 | −2 |
| 28 | 3 | 2400 | 150 | −2 |
| 29 | 4 | 2400 | 180 | −2 |
| 30 | 5 | 2400 | 180 | −9 |
| 31 | 6 | 2400 | 180 | −4 |
| 32 | 5, 6 | 2400 | 180 | −2 |
| 33 | 7 | 2400 | 180 | −130 |
| 34 | 8 | 3600 | 180 | No change |
| 35 | 9 | 2400 | 155 | −6 |
| 36 | 9 | 2400 | 155 | Strips completely |
| 38 | 10 | 2400 | 180 | +1 |
| 41 | 16 | 2400 | 150 | No change |

TABLE 4

Etch-Rate

| Example | Polymer | Spin-speed (rpm) | Bake temp (° C.) | Etch-Rate (Angstrom/min) |
|---|---|---|---|---|
| 26 | 2 | 2000 | 150 | 970 |
| 28 | 3 | 2400 | 150 | 1172 |
| 31 | 6 | 2400 | 180 | 994 |
| 32 | 5, 6 | 2400 | 180 | 1099 |
| 37 | 9 | 2400 | 180 | 888 |
| 39 | 12 | 2400 | 185 | — |
| 41 | 14 | 2000 | 185 | — |

TABLE 5

Optical Parameters

| Example | Polymer | Spin-speed (rpm) | Bake temp (° C.) | Wavelength (nm) | n | k |
|---|---|---|---|---|---|---|
| 27 | 2 | 2400 | 150 | 193 | 1.60 | 0.400 |
| 28 | 3 | 2400 | 150 | 193 | 1.74 | 0.405 |
| 30 | 5 | 2400 | 180 | 193 | 1.66 | 0.321 |
| 31 | 6 | 2400 | 180 | 193 | 1.64 | 0.520 |
| 31 | 6 | 2400 | 180 | 248 | 1.79 | 0.287 |
| 32 | 5, 6 | 2400 | 180 | 193 | 1.63 | 0.440 |

EXAMPLE 42

ARC Preparation and Lithographic Processing

An ARC composition of the invention was prepared in a 1-pot reaction with a low-molecular weight polyester containing naphthyl and terephthalyl groups. The ARC also contained a crosslinker component (melamine/benzoguanimine crosslinker).

A 10 weight % solution of a low MW polyester (MW 800) composed of approximately 25 mole % 2,6-naphthalenedicarboxylate groups, 25 mole % terephthalate groups, 50% glycerol, and 0.070% p-toluenesulfonic acid in a solvent blend consisting of 70 weight % methyl 2-hydroxyisobutyrate and 30 weight % anisole was prepared by adding these solvents to a warm polymer melt consisting of 70 weight % polymer, 29.3 weight % anisole and 0.7% p-toluenesulfonic acid. This 10% polymer solution was then used to prepare an antireflective composition.

An antireflective composition was prepared by taking 6.986 g the above 10% polymer solution, 0.2 g of Cymel 1123, 0.1 g of hexamethoxy melamine, 0.0014 g of R-08 surfactant (DaiNippon Ink Co.) into 13.654 g of 1-methoxy-2-propanol and 29.059 g of methyl 2-hydroxyisobutyrate. The solution was then filtered through a 0.1 micron pore size Teflon membrane into a clean bottle.

The antireflective coating was spin coated on a 150 mm silicon wafer at about 2000 rpm, and then baked using a proximity hotplate at 200° C. using a Tel Mark 8 wafer coating track machine. The antireflective film coating thickness after bake was 34 nm. Next, a ShinEtsu-551 deep-UV photoresist was spin coated on top of the antireflective film, and baked at 110° C./60 seconds to give a 410 nm thick film of photoresist. The photoresist was then exposed through a target mask using a 248 nm KrF wafer stepper with a 0.60 NA (2/3 annular setting). The resist film was then given a 115° C./60 sec post-exposure bake, and then developed using Shipley MF CD-26 developer (2.38% tetramethyl ammonium hydroxide in water) in a standard 60 second single-puddle process.

Scanning electron microscopy at 60,000 magnification to examine the quality of the resist patterns. Results showed excellent pattern fidelity with sharp clean interface between the resist and the antireflective layer. The resist pattern was free of "standing wave" artifacts caused by reflective interference phenomena. That scanning electron microscopy image (SEM) of the resist pattern over the antireflective coating is shown in FIG. 1 of the drawings. That SEM results of a 0.18 micron 1:1 line:space pattern using the antireflective composition of this Example 34 as prepared above.

The real and imaginary refractive indices for the antireflective layer of this Example 42 as prepared above applied on a silicon wafer was measured using ellipsometric techniques. The real refractive index, n=1.986 and the imaginary refractive index, k=0.536.

The real and imaginary refractive indices for the antireflective composition of this Example 42 as prepared above were used as input parameters to calculate the reflectivity at 248 nm for the antireflective stack into a photoresist using the PROLITH 2 simulation package (Finle Technology, division of ASML, The Netherlands). Results are that the reflectivity is 0.5% when the antireflective film has a thickness of 34 nm.

EXAMPLE 43

ARC Preparation and Lithographic Processing

An ARC of the invention was prepared from a 1-pot preparation. The ARC containing a moderate molecular weight polyester containing naphthyl and terephthalyl groups and a crosslinker (a melamine/glycouril crosslinker).

An antireflective composition was prepared by taking 6.986 g the above 10% polymer solution of Example 34 above, 0.2 g of tetramethoxyglycouril, 0.1 g of hexamethoxy melamine, 0.0014 g of R-08 surfactant (DaiNippon Ink Co.) into 13.654 g of 1-methoxy-2-propanol and 29.059 g of methyl 2-hydroxyisobutyrate.

Figure 2:
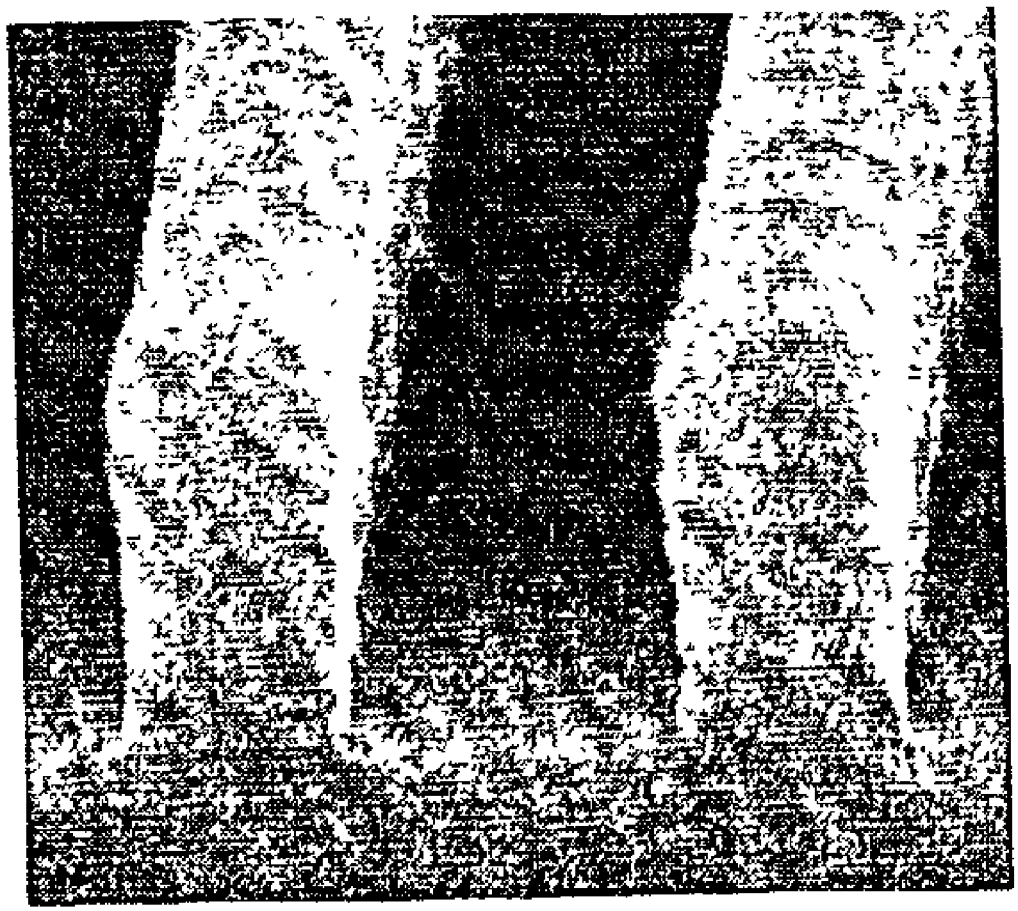
FIG. 2 shows a SEM of a developed photoresist relief image over an antireflective composition having a polyester resin, of Example 35 which follows.

The antireflective composition was filtered and lithographically tested in the same manner as Example 42 above. Scanning electron microscopy at 60,000 magnification to examine the quality of the resist patterns. Results showed excellent pattern fidelity with sharp clean interface between the resist and the antireflective layer. The resist pattern was free of "standing wave" artifacts caused by reflective interference phenomena. That scanning electron microscopy image (SEM) of the resist pattern over the antireflective coating is shown in FIG. 2 of the drawings. That SEM showed a 0.18 micron 1:1 line:space pattern using the antireflective composition of this Example 43 as prepared above.

The real and imaginary refractive indices for the antireflective layer of this Example 43 as prepared above applied on a silicon wafer was measured using ellipsometric techniques. The real refractive index, n=1.984 and the imaginary refractive index, k=0.502.

The real and imaginary refractive indices for the antireflective of Example 43 were used as input parameters to calculate the reflectivity at 248 nm for the antireflective stack into a photoresist using the PROLITH 2 simulation package (Finle Technology, division of ASML, The Netherlands). Results are that the reflectivity is 1.0% when the antireflective film has a thickness of 33 nm:

EXAMPLE 44

ARC Preparation and Lithographic Processing

An ARC of the invention was prepare din a one-pot procedure by admixing a polyester containing naphthyl and terephthalyl groups with a crosslinker (melamine/benzoguanimine crosslinker).

A polymer related to that of Example 1 above was synthesized, except that the Mw was increased to 3000 by extending the reaction time. A 10 weight % solution of the Mw 3000 polyester with 0.070 weight % p-toluenesulfonic acid in a solvent blend of 70 weight % methyl 2-hydroxyisobutyrate and 30 weight anisole % was prepared in the same manner as described in Example 42 above.

It was found this polymer had somewhat different solubility properties as the polymer of Example 42, when formulated into an antireflective composition. Accordingly, we found that adjusting the solvent composition led to a homogenous solution which spun to give antireflective film which were essentially defect free. Thus, an antireflective composition was prepared by mixing 6.986 g of the 10% polymer solution of Example 3, 0.2 g of tetramethoxyglycouril, 0.1 g of hexamethoxy melamine, 0.0014 g of R-08 surfactant (DaiNippon Ink Co.) into 22.05 g of 1-methoxy-2-propanol, 4.90 g of anisole and 17.65 g of methyl 2-hydroxyisobutyrate.

The antireflective composition was filtered in the same manner described in Example 42. The antireflective film quality was examined with a KLA8100 "top-down" low-voltage scanning electron microscope inspection tool. The film was found to be free of optical defects and also defects observable by the inspection tool.

Figure 3:
FIG. 3 shows a SEM of a developed photoresist relief image over an antireflective composition having a polyester resin, of Example 36 which follows.

This antireflective composition was lithographically tested in the same manner as Example 42. Scanning electron microscopy at 60,000 magnification to examine the quality of the resist patterns. Results showed excellent pattern fidelity with sharp clean interface between the resist and the antireflective layer. The resist pattern was free of "standing wave" artifacts caused by reflective interference phenomena. That scanning electron microscopy image (SEM) of the resist pattern over the antireflective coating is shown in FIG. 3 of the drawings. That SEM shows of a 0.18 micron 1:1 line:space pattern using the antireflective composition of this Example 44.

The real and imaginary refractive indices for the antireflective layer of Example 44 above applied on a silicon wafer was measured using ellipsometric techniques. The real refractive index, n=1.985 and the imaginary refractive index, k=0.598.

EXAMPLE 45

ARC Preparation and Lithographic Processing

Preparation and evaluations of ARCs made from blends of a 1-pot polyester containing naphthyl and terephthalyl groups with melamine/benzoguanimine crosslinker and anthracenyl acrylate polymers. In the case of Example 45d, the ARC was prepared from a polyester of Example 17 which comprising naphthyl groups and tris(hydroxymethyl) ethan with a benzoguanimine crosslinker and anthracenyl acrylate polymers.

In this example, a polyester and an acrylate polymer comprising anthracene were blended in an antireflective composition. Thus, an antireflective composition was prepared by blending the 10 weight % polyester solution of Example 3 with a branched acrylate polymer of Mw 160,000 consisting of 23 mole % 9-anthracenyl methylene methacrylate, 29 mole % 2-hydroxyethyl methacrylate, 45.6 mol % methyl methacrylate and 2.4 mole % diethylene glycol dimethacrylate. Accordingly, antireflective compositions were prepared using the polymers described in the above sentence according to the following table (weights shown in g as dry polymer):

| Composition | acrylate polymer | polyester | Cymel 1123 | hexamethoxy melamine | p-toluene sulfonic acid | anisole | 1-methoxy-2-propanol | R-08 | methyl 2-hydroxy isobutyrate |
|---|---|---|---|---|---|---|---|---|---|
| 45a | 0 | 0.699 | 0.200 | 0.100 | 0.007 | 4.90 | 22.05 | 0.0014 | 22.05 |
| 45b | 0.489 | 0.210 | 0.200 | 0.100 | 0.007 | 4.90 | 22.05 | 0.0014 | 22.05 |
| 45c | 0.349 | 0.349 | 0.200 | 0.100 | 0.007 | 4.90 | 22.05 | 0.0014 | 22.05 |

The real and imaginary refractive indices (n & k) for the antireflective layer of Example 45 applied on a silicon wafer was measured using ellipsometric techniques. The real and imaginary refractive indices were then used as input parameters to calculate the reflectivity at 248 nm for the antireflective stack into a photoresist using the PROLITH 2 simulation package (Finle Technology, division of ASML, The Netherlands), in order to determine the optimal antireflective thickness to minimize reflectivity. These results are listed in the Table below:

| Composition | real index n | imaginary index k | thickness to minimize reflectivity |
|---|---|---|---|
| 45a | 1.9489 | 0.5885 | 33 nm |
| 45b | 1.8042 | 0.5496 | 39 nm |
| 45c | 1.7359 | 0.5092 | 43 nm |
| 45d | 1.82 | 0.59 | 40 nm |

The antireflective coatings 45a through 45c were spin coated on a 200 mm silicon wafer at about 2000 rpm, and then baked using a proximity hotplate at 200° C. using a Tel Mark 8 wafer coating track machine. The antireflective film coating thickness after bake was 34 nm. Next, a ShinEtsu-402 deep-UV photoresist was spin coated on top of the antireflective film, and baked at 90° C./60 seconds to give a 600 nm thick film of photoresist. The photoresist was then exposed through a target mask using a 248 nm KrF wafer stepper with a 0.60 NA. The resist films were then given a 110° C./60 sec post-exposure bake, and then developed using Shipley MF CD-26 developer (2.38% tetramethyl ammonium hydroxide in water) in a standard 60 second single-puddle process.

Figure 4:
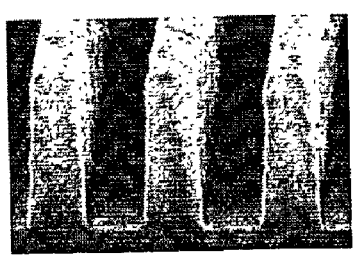
FIG. 4 shows SEMs of developed photoresist relief images over antireflective compositions having a polyester resin, of Example 45 (three different resists of Example 45a, 45b and 45c) which follows.
Figure 4:
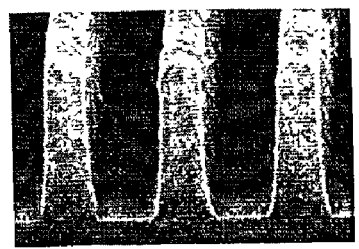
Figure 4:

Scanning electron microscope results of 1:1 180 nm L:S patterns on the antireflectives are shown in FIG. 4 of the drawings. Those relief images of Examples 45a through 45c all showed excellent pattern fidelity with no evidence of "footing" or undercutting at the resist:antireflectant interface.

EXAMPLE 46

ARC Preparation and Lithographic Processing

Preparation and evaluations of ARCs made from polyesters containing higher amounts of naphthoate groups.

Polymers similar to Example 45 above were synthesized, except that the concentration of 2,6-naphthalenedicarboxylate groups in the polyester polymer was increased. Antireflective compositions were prepared from these polymers and tested in the same manner as described in Example 45 above. Results are tabulated below:

| Example | Mw | real index n | imaginary index k | lithographic results of the resist: anti-reflective interface |
|---|---|---|---|---|
| 45a | 3000 | 2.012 | 0.5946 | clean interface, no footing |
| 45b | 3000 | 2.059 | 0.5749 | clean interface, no footing |

The results indicate that polymers containing higher concentrations of 2,6-naphthalenedicarboxylate will also yield high performance anti-reflective coatings.

EXAMPLE 47

ARCs Particularly Suitable for 193 nm

A composition for 193 nm reflection control was prepared using polyester polymer. That polyester was prepared from the thermal condensation reaction of dimethylnitroterephathalate, 1,3,5-trishydroxyethylcyanuris acid, dimethylisophthalate, dimethylphthalate and glycerol. The anti-reflectant composition contained 2.6% polyester polymer GW3488-13, 0.75% of tetramethoxyglycouril (Cytec), 0.041% of Nacure 5225 (King Ind.), and 96.6% of methyl-2-hydroxyisobutyrate (Aldrich). The composition was filtered through a 0.2 um filter.

The prepared antireflectant composition was coated on a silicon wafer by means of a spin coater and then heated on a hot plate at a temperature of 215° C. for 60 seconds. A cross-linked organic film with a uniform thickness of 81 nm was obtained. A positive acting 193 nm photoresist (Shipley Company TS 10) was spin-coated on top of the cross-linked organic anti-reflectant film; the photoresist film was then heated on a hot plate at a temperature of 120 degrees C. for 60 seconds. The photoresist was exposed to patterned 193 nm radiation in a GCA 193 nm stepper with NA=0.60 and partial coherence=0.70. After exposure, the photoresist was heated on a hotplate at a temperature of 120° C. for 60 seconds. The photoresist was then contacted with a 0.26N aqueous solution of tetramethylammonium hydroxide. After 60 seconds, the tetramethylammonium hydroxide solution was rinsed off the wafer with distilled, deionized water and the wafer was spun dried. Line and space patterns were obtained.

EXAMPLE 48

ARCs Particularly Suitable for 193 nm

A composition for 193 nm reflection control was prepared using a polyester polymer that was prepared from the thermal condensation reaction of dimethylnitroterephathalate, dimethylterephthalate, ethylene glycol and glycerol. The anti-reflective composition was prepared by admixing 3.06 wt % of that polyester polymer, 0.80 wt % of tetramethoxyglycouril (Cytec), 0.14 wt % of p-toluenesulfonic acid (Aldrich), and 96.0 wt % of methyl-2-hydroxyisobutyrate, with those wt. Percent based on total weight of the composition. The composition was filtered through a 0.2 um filter.

The anti-reflective composition was coated on a silicon wafer by means of a spin coater and then heated on a hot plate at a temperature of 215 degrees C. for 60 seconds. A cross-linked organic film with a uniform thickness of 82 nm was obtained. A positive acting 193 nm photoresist (Shipley Company TS 10) was spin-coated on top of the cross-linked organic anti-reflective film; the photoresist film was then heated on a hot plate at a temperature of 120 degrees C. for 60 seconds. The photoresist was exposed to patterned 193 nm radiation in a GCA 193 nm stepper with NA=0.60 and partial coherence=0.70. After exposure, the photoresist was heated on a hotplate at a temperature of 120 degrees C. for 60 seconds. The photoresist was then contacted with a 0.26N aqueous solution of tetramethylammonium hydroxide. After 60 seconds, the tetramethylammonium hydroxide solution was rinsed off the wafer with distilled, deionized water and the wafer was spun dried. Line and space patterns were obtained.

Lithography Results

Wafers patterned with 193 nm radiation were cross-sectioned and examined by scanning electron microscopy (SEM). Dense line and space patterns and isolated line patterns at 150 nm feature size were evaluated for profile defects, including "standing waves" (an unevenness in the resist sidewalls caused by reflective light interference modulating the photoacid concentration following exposure). No standing waves were observed on resist features patterned over the anti-reflectant compositions of Example 45 or Example 46.

| AR coating | Resist | Esize(l50 nm 1:1) | Result |
|---|---|---|---|
| Example 45 | TS10 | 24 mJ/cm2 | no standing waves |
| Example 46 | TS10 | 24 mJ/cm2 | no standing waves |

EXAMPLES 49–54

Anti-Reflective Coating Formulation and Characterization

Figure 5:
FIG. 5 shows 1:1 lines and spaces (140 nm masking linearity) produced in Examples 50 through 54 which follow.
Figure 5:
Figure 5:
Figure 5:
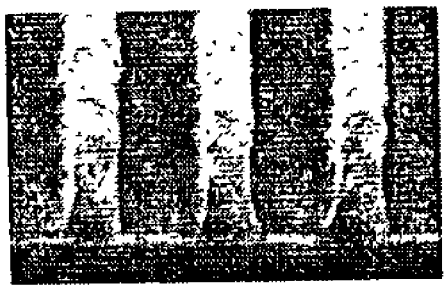
Figure 5:
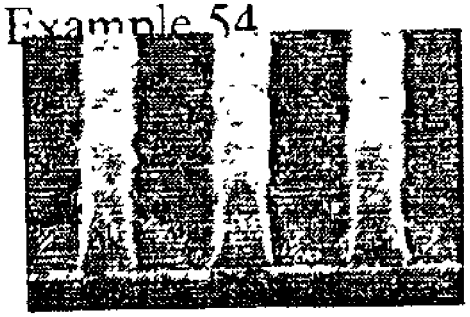

Anti-reflective coating compositions of the above examples were characterized for optical density (OD), optical properties at 193 nm, oxide etch-rate, and lithographic properties (Table 6, FIG. 5).

Samples for testing were formulated by charging the indicated components into a clean bottle. The samples were shaken or placed on rollers until completely dissolved. Each sample was then passed through a 0.2 μm PTFE membrane filter into a clean bottle. Wafers (silicon or quartz) were spin-coated with the formulated samples using a spin time of 30–60 seconds; spin-speeds varied as necessary to obtain film thickness in the range of 40–120 nm. The spin-coated wafers were baked on a hotplate for 60 seconds at 215° C. Film thickness (on silicon wafers) was measured by ellipsometry.

General Procedure for OD Determination

Samples were spin-coated onto both silicon and quartz wafers. Film thickness on the silicon wafer was measured as a proxy for film thickness on the quartz wafer. The absorptivity of the films on quartz was determined at 193 nm by UV spectrophotometry vs. an uncoated quartz wafer. The OD of the formulation was calculated using film thickness and absorbtivity measurements (Table 6).

General Procedures for Measuring Optical Parameters

Formulated samples were spin-coated onto silicon wafers. Ellipsometric techniques were applied to determine the real (n) and imaginary (k) refractive indices at 193 nm (Table 6).

General Procedure for Measuring Etch-Rate

Formulated samples were spin-coated onto silicon wafers. Film thickness was measured using ellipsometry. The films were then subject to oxide etch ($C_4F_8/O_2/CO/Ar$) for 30–60 seconds. The thickness of the etched films was re-measured and the bulk etch rate was calculated (Table 6).

General Procedure for Lithographic Evaluation

The antireflective coatings of examples 50–54 were spin coated on 150 mm silicon wafers at 2000–3000 rpm, and then baked using a proximity hotplate at 215° C. using a FSI Polaris 2200 wafer coating track machine. The antireflective film coating thickness after bake was 80–82 nm. Next, a 193 nm photoresist was spin coated on top of the antireflective film, and baked at 120° C./90 seconds to give a 330 nm thick film of photoresist. The photoresist was then exposed through a target mask using a 193 nm ArF wafer stepper with a 0.60 numerical aperature and 0.70 partial coherence. The exposed resist film was given a 120° C./60 sec post-exposure bake and then developed using a commercially available developer (2.38% tetramethyl ammonium hydroxide in water) in a standard 60 second single-puddle process.

The quality of the resist patterns was examined by scanning electron microscopy (SEM) at 75,000 magnification. The SEM images showed good pattern fidelity with a clean interface between the resist and the antireflective layer. The resist pattern was free of "standing wave" artifacts caused by reflective interference phenomena. The SEM image of a 140 nm 1:1 line:space resist pattern over the antireflective coating of Examples 49–53 are shown in FIG. 5.

The real and imaginary refractive indices for the antireflective coating composition of Example 46 were used as input parameters to calculate the reflectivity at 193 nm for the antireflective stack into a photoresist using the PRO-LITH 2 simulation package (Finle Technology, division of ASML, The Netherlands). Results of the simulation indicate that the reflectivity is 0.9% when the anti-reflective film of Example 49 has a thickness of 80 nm.

TABLE 6

OD, Optical Parameters, and Oxide Etch Rate of Examples 49–54

| Example | Polymer | OD/μm (193 nm) | n/k (193 nm) | Oxide Etch rate (Angstrom/min) |
|---|---|---|---|---|
| 49 | 19 | 9.3 | 1.60/0.40 | 1172 |
| 50 | 20 | 10.6 | 1.82/0.39 | 1352 |
| 51 | 21 | 11.4 | 1.84/0.38 | 1425 |
| 52 | 22 | 11.7 | | 1395 |
| 53 | 23 | 13.8 | 1.81/0.48 | 1167 |
| 54 | 24 | 13.0 | 1.79/0.45 | 1185 |

The foregoing description of this invention is merely illustrative thereof, and it is understood that variations and modifications can be made without departing from the spirit or scope of the invention as set forth in the following claims.

What is claimed is:

1. A coated substrate comprising:
   an antireflective composition layer comprising a polyester resin that comprises polymerized trihydroxycyanurate groups;
   a photoresist layer over the antireflective composition layer.

2. The substrate of claim 1 wherein the polyester resin comprises aromatic groups as backbone units.

3. The substrate of claim 2 wherein the aromatic groups comprise optionally substituted phenyl groups.

4. The substrate of claim 1 wherein the polyester resin comprises pendant aromatic groups.

5. The substrate of claim 1 wherein the resin backbone comprises ester repeat units.

6. The substrate of claim 1 wherein the antireflective composition is crosslinked.

7. A method of forming a photoresist relief image comprising:
   (a) applying an antireflective composition layer on a substrate, the antireflective composition comprising a polyester resin that comprises polymerized trihydroxycyanurate groups;
   (b) applying a photoresist composition layer over the antireflective composition layer; and
   (c) exposing and developing the photoresist layer to provide a photoresist relief image.

8. The method of claim 7 wherein the polyester resin comprises aromatic groups as backbone units.

9. The method of claim 8 wherein the aromatic groups comprise optionally substituted phenyl groups.

10. The method of claim 7 wherein the polyester resin comprises pendant aromatic groups as pendant groups.

11. The method of claim 7 wherein the resin backbone comprises ester repeat units.

12. The method of claim 7 wherein the antireflective composition is crosslinked by thermal treatment prior to applying the photoresist layer.

13. The method of claim 7 wherein the photoresist layer is exposed with radiation having a wavelength of less than about 200 nm.

14. The method of claim 7 wherein the photoresist layer is exposed with radiation having a wavelength of about 193 nm.

* * * * *